United States Patent [19]
Stehlin

[11] 3,813,562
[45] May 28, 1974

[54] TRIGGERED MONOSTABLE MULTIVIBRATOR CIRCUIT UTILIZING COMPLEMENTARY TRANSISTOR PAIRS

[75] Inventor: Robert A. Stehlin, Richardson, Tex.

[73] Assignee: Texas Instruments Incorporated, Dallas, Tex.

[22] Filed: Apr. 5, 1973

[21] Appl. No.: 348,387

Related U.S. Application Data

[60] Division of Ser. No. 166,288, July 26, 1971, Pat. No. 3,767,944, which is a continuation of Ser. No. 787,793, Dec. 30, 1968, abandoned.

[52] U.S. Cl. .......... 307/273, 307/288
[51] Int. Cl. .......... H03k 3/10
[58] Field of Search .......... 307/273, 288

[56] References Cited

UNITED STATES PATENTS

| | | | |
|---|---|---|---|
| 2,948,820 | 8/1960 | Bothwell | 307/288 |
| 3,474,261 | 10/1969 | Ryerson et al. | 307/291 |
| 3,488,513 | 1/1970 | Ryerson | 307/273 |
| 3,544,817 | 12/1970 | Thiele | 307/288 |
| 3,577,015 | 5/1971 | Niemann et al. | 307/273 |

*Primary Examiner*—Stanley D. Miller, Jr.
*Attorney, Agent, or Firm*—Harold Levine; Andrew M. Hassell; William E. Hiller

[57] ABSTRACT

The disclosure is directed to electronic multivibrator circuits utilizing two pairs of series connected complementary transistors, with the bases of each of the transistors being cross-coupled to the juncture point of the transistors of the opposite pair. A monostable multivibrator is provided which has the base of one of the transistors coupled through a resistance to ground potential, and includes a normally non-conductive transistor connected to receive a triggering signal for initiating a mono-stable timing period. A bistable multivibrator is provided which includes triggering transistors connected across symmetrical portions of the circuitry for receiving set and reset triggering signals to control the bistable operation of the circuit. A free-running multivibrator is provided which includes resistive current paths from two of the transistor bases to ground potential for generation of a periodic pulse train output upon the application of electrical power.

5 Claims, 15 Drawing Figures

TRIGGERED MONOSTABLE MULTIVIBRATOR CIRCUIT UTILIZING COMPLEMENTARY TRANSISTOR PAIRS

This application is a division of application Ser. No. 166,288, filed July 26, 1971, now U.S. Pat. No. 3,767,944, which application is a continuation of application Ser. No. 787,793, filed Dec. 30, 1968, now abandoned.

The invention herein described was made in the course of or under a contract or subcontract thereunder with the Department of the Army.

This invention relates to multivibrators, and more particularly to multivibrators utilizing pairs of series connected complementary transistors.

Multivibrator circuits commonly find many applications in pulse generation and timing circuits. However, previously developed multivibrators have often not been usable in environments wherein very low or variable sources of electrical power are available. Further, many multivibrators requiring triggering inputs have not been satisfactorily triggered by very small input triggers, and have also not provided linear operation over a large range of temperatures. Problems in conventional multivibrators have also arisen with respect to noise immunity and drive capabilities when driving loads in both positive and negative directions.

In accordance with one aspect of the present invention, a triggering system is provided for multivibrator which includes a transistor having a collector and an emitter collected across a portion of the multivibrator circuit. The transistor has a base for receiving a trigger signal, with resistance means connected between the base of the transistor and a source of electrical power for biasing the transistor just under the conduction threshold thereof. A unidirectional conducting impedance is coupled between the base and the emitter of the transistor, with the impedance and the transistor having substantially similar conduction threshold and temperature coefficient characteristics.

In accordance with another aspect of the invention, a bistable multivibrator includes first and second series connected electronic switching devices each having conductive and non-conductive states, only one of the switching devices in each pair being in a conductive state at one time. Each of the switching devices has a control electrode which is coupled through a current path to the juncture of the opposite pair of switching devices. Circuitry is provided which is responsive to triggering signals for selectively changing the state of conduction of each of the switching devices in order to provide output signals at terminals of the multivibrator.

In accordance with another aspect of the invention, a free-running multivibrator includes first and second pairs of series connected complementary electronic switching devices having conductive and non-conductive states. Each of the switching devices has a control electrode which is cross-coupled to the juncture point of the switching devices of the opposite pair. Terminals are provided for directing electrical power across the pairs of switching devices such that the states of conduction of each of the switching devices is periodically changed to provide an output pulse train.

For a more complete understanding of the present invention and for further objects and advantages thereof, reference is now made to the following description taken in conjunction with the accompanying drawings, in which:

FIG. 1 is a schematic diagram of a multivibrator utilizing the trigger circuit of the invention;

FIGS. 2(*a*)–2(*f*) illustrate waveforms of various portions of the circuit shown in FIG. 1 during the operation thereof;

Figure 1:
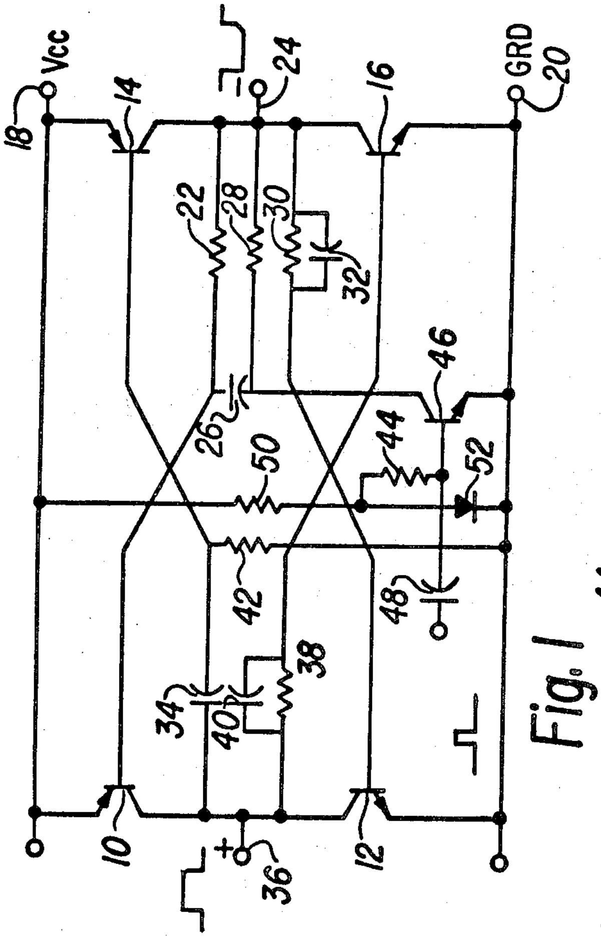

Referring to FIG. 1, a monostable multivibrator circuit comprises a first pair of complementary transistors 10 and 12 connected in a series collector-to-collector configuration. The term complementary will be used hereafter to refer to transistors, or other electronic switching devices, which are of opposite conductivity types but which have matched parameters such as $V_{BE}$, $V_{CE(SAT)}$, $f_T$ and $h_{FE}$. Transistor 10 is a PNP-type transistor, while transistor 12 is an NPN-type transistor with matched parameters. Similarly, a second pair of complementary transistors 14 and 16 are also connected in a collector-to-collector series configuration. Transistor 14 is a PNP-type transistor, and transistor 16 is an NPN-type transistor. A positive supply of bias voltage $V_{CC}$ is applied across the pairs of series connected transistors at terminals 18 and 20. It will of course be understood that the transistor types utilized in the present circuit may be reversed upon the reversal of polarity of the biasing voltage.

The base of transistor 10 is connected through a resistor 22 to an output terminal 24 located at the juncture of the collectors of transistors 14 and 16. A capacitor 26 and a resistor 28 are connected across the resistance 22. The base of the transistor 12 is coupled through a parallel resistor 30 and capacitor 32 to output terminal 24. The base of transistor 14 is cross-coupled via a capacitor 34 to a second output terminal 36 which is located at the juncture of the collectors of transistors 10 and 12. The base of transistor 16 is cross-coupled via a parallel resistance 38 and capacitor 40 configuration to the output terminal 36.

The base of transistor 14 is coupled through a resistance 42 to circuit ground. A trigger transistor 46 is connected at its collector to the juncture between capacitor 26 and resistor 28 and at its emitter to circuit ground. The base of the transistor 46 is connected to a resistor 44, and also to a capacitor 48 to a supply of input trigger impulses. Resistor 44 is connected to the juncture of a resistor 50 and to the anode of a unidirectional conducting impedance 52 which preferably comprises a semiconductor diode. Transistor 46 is biased by resistors 44 and 50 just below cutoff. Diode 52 and the emitter of transistor 46 have substantially identical conduction and temperature coefficient characteristics.

Figure 2:
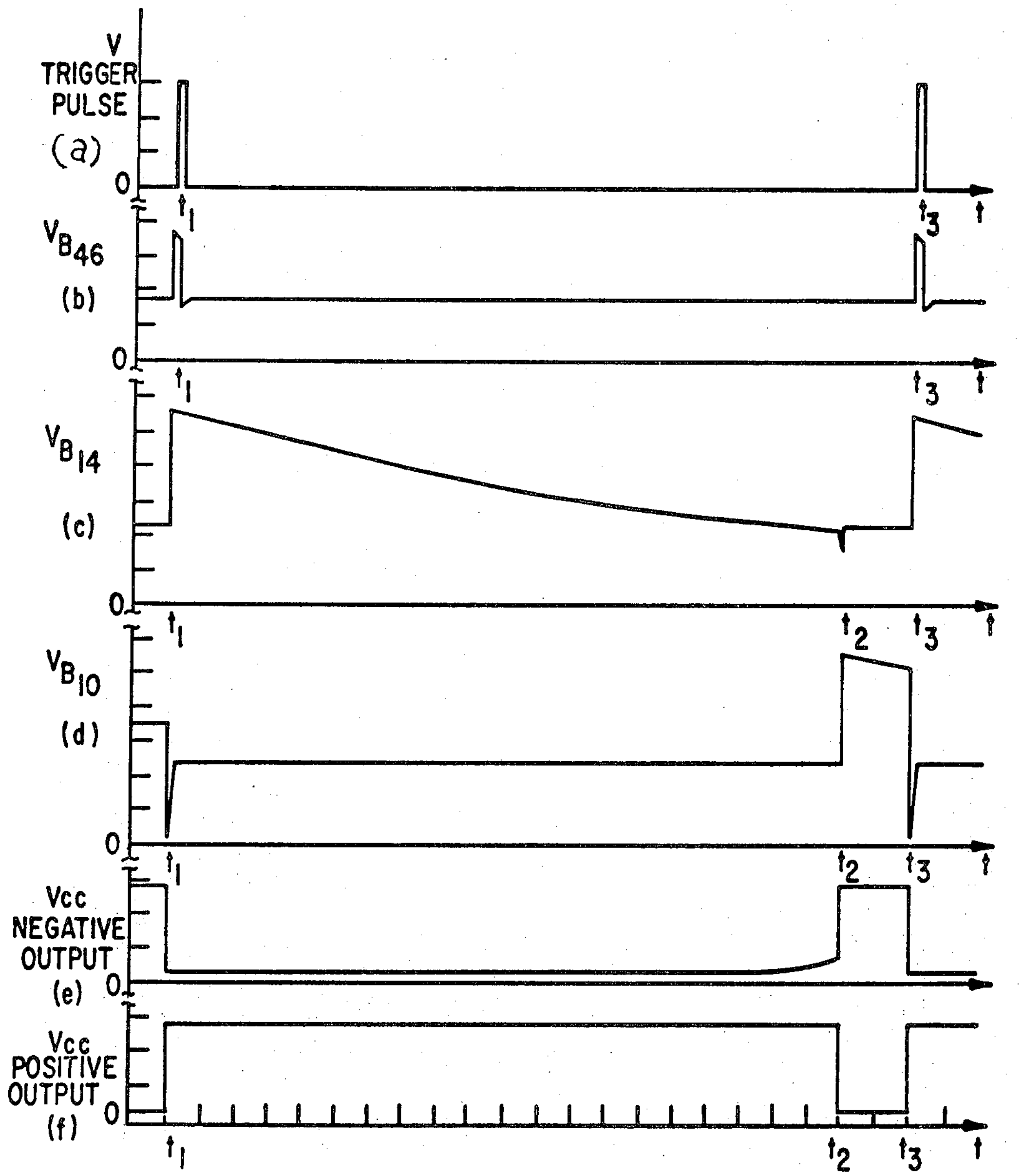

The operation of the monostable circuit shown in FIG. 1 will become apparent from the waveforms shown in FIGS. 2(*a*)–2(*f*) and from the following description. In the steady or quiescent state of the circuit, transistors 12 and 14 are held in conductive states, while transistors 10 and 16 are in non-conductive states. Transistor 14 is held in a conductive state by base current flowing through resistor 42 to circuit ground. Transistor 12 is held in a conductive state by base current drive through transistor 14 and resistor 30. Transistor 10 is held in a non-conductive state by the negative output being high. Transistor 16 is held in a non-conductive state by the positive output being low.

In the steady or quiescent state, a substantially zero output voltage appears at the output terminal 36, while a relatively high voltage approximating $V_{CC}$ appears at the output terminal 24. The steady state outputs are illustrated by the curves appearing in FIGS. 2(*e*) and 2(*f*) in the time interval $0$–$t_1$. Transistor 46 is normally maintained just below its conduction threshold by the biasing effect applied through resistors 44 and 50 and diode 52. Thus, upon the application of a relatively low amplitude trigger pulse to the base of transistor 46, shown in FIG. 2(*a*) at $t_1$, the transistor 46 becomes momentarily conductive as shown in FIG. 2(*b*) at $t_1$. Conduction of transistor 46 causes the base of transistor 10 to go negative, as illustrated in FIG. 2(*d*) at $t_1$.

Transistor 10 then becomes conductive and the positive output shown in FIG. 2(*f*) becomes positive at a voltage approaching $V_{CC}$. Base drive is provided for transistor 16 through transistor 10 and resistor 38 to turn transistor 16 on. The conduction of transistor 16 causes transistor 12 to be held in a non-conductive state because of the low voltage applied across resistor 30. A high voltage appears on the base of transistor 14, FIG. 2(*c*), because of the capacitor 34, thereby turning transistor 14 off.

The voltage applied to the base of the transistor 14 decays at an exponential rate as illustrated by the waveform in FIG. 2(*c*) between the time interval $t_1$–$t_2$. The voltage thus decays to a point wherein transistor 14 again becomes conductive at time $t_2$. The timing interval $t_1$–$t_2$ of the circuit depends upon the values of capacitor 34 and the resistor 42. Upon the conduction of transistor 14, transistors 10 and 16 are turned off, while transistor 12 is turned on.

The conduction of transistor 14 at $t_2$ brings the negative output shown in FIG. 2(*e*) back up to a relatively high voltage approximating $V_{CC}$. Simultaneously, the positive output voltage falls to approximately zero, as illustrated in FIG. 2(*f*). The circuit then remains in the quiescent state until again triggered by another trigger pulse at $t_3$, wherein the monostable timing cycle again occurs.

Using a conventional equivalent circuit mathematical approach with the multivibrator circuit of FIG. 1, it may be shown that the pulse width of the circuit is represented as follows:

$$t_{ON} = R_{42}\, C_{34}\, \ln\, [2V_{CC}-V_{BE}-2V_{CE(SAT)}]/[V_{CC}-V_{BE}],$$

wherein:

$t_{ON}$ = time interval of output pulse in seconds,
$R_{42}$ = the resistance of ohms of resistor 42,
$C_{34}$ = the capacitance in farads of capacitors 34,
$V_{CC}$ = magnitude in volts of the biasing voltage,
$V_{BE}$ = the voltage across the base and emitter of transistor 14,
$V_{CE(SAT)}$ = the voltage across the collector and emitter of transistor 14 during saturation.

From the equation, it will be seen that the timing period for the monostable multivibrator of the present invention is dependent upon the values of resistor 42, the magnitude of the capacitor 34, and the magnitude of the bias voltage $V_{CC}$. Thus, by varying the magnitude of resistor 42 or capacitor 34, the frequency of operation of the circuit may be selectively varied. Moreover, by varying the magnitude of $V_{CC}$ applied to the circuit, the length of the timing interval of the circuit may be changed.

This circuit has a constant trigger voltage over wide temperature ranges due to the matched parameters of transistor 46 and diode 52. The present circuit has also been found to provide excellent operating characteristics with a supply voltage as low as 1 volt, due to the utilization of the complementary transistor configurations. These complementary configurations do not require collector current when the PNP transistors are in the non-conductive state, and the primary power dissipated by the circuit is the required base current for the transistors. The present circuit is operable with extremely low bias voltages, as the circuit does not require two conducting transistors in series. The present circuit will operate over a large range of bias voltages, with both the high and low output voltages clamped by the saturation of at least one transistor.

Figure 3:
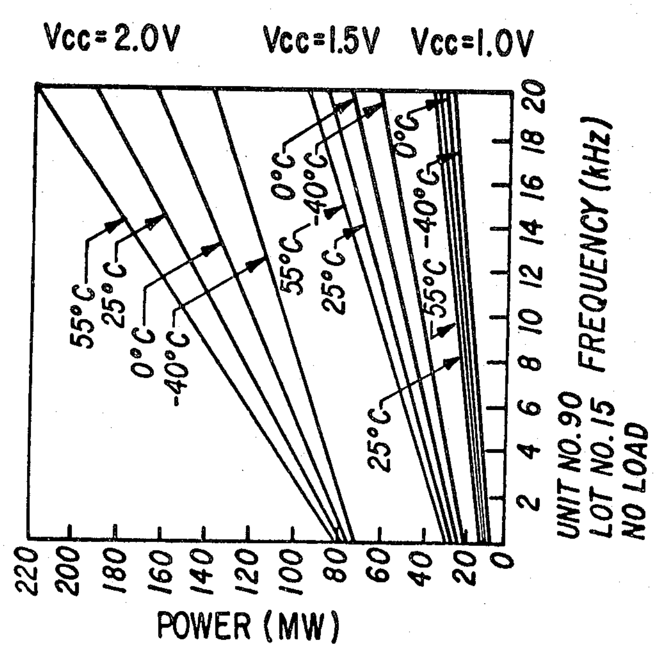
FIG. 3 is a graph illustrating the variance of frequency versus input power of the circuit shown in FIG. 1.

FIG. 3 illustrates the power requirements for varied frequencies of operation of the circuit of FIG. 1. The standby power for the circuit can be made extremely low, being limited only by the ability of the transistors to maintain sufficient current gain at very low collector current. The slope of the curves shown in FIG. 3 is determined by the total circuit capacitance, of which the speedup capacitors 32 and 40 of the circuit comprise a major portion thereof. The slope of the curves is thus a measure of the A.C. parameters, and the starting point of the curves is a measure of the D.C. parameters. For higher values of $V_{CC}$ than 1 volt, smaller capacitance could be utilized in the circuit, and thus the slope of the curves may be substantially reduced. Additionally, it will be seen that the power requirements of the circuit increase as the temperature of the environment is increased, and as the magnitude of $V_{CC}$ is increased.

Figure 4:
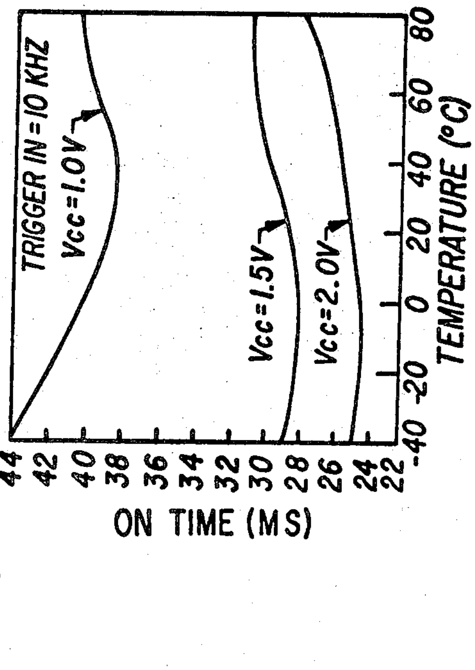
FIG. 4 is a graph illustrating the variance of on time versus temperature of the circuit shown in FIG. 1.

FIG. 4 illustrates the variance of the on-time of the circuit shown in FIG. 1 as the ambient temperature is varied. It will be seen that, upon proper matching of the temperature coefficients of the emitter-base junction of transistor 14 and the resistor-temperature coefficient that a relatively constant on-time for varying magnitudes of $V_{CC}$ may be obtained for a range of temperatures from −40°C to 80°C.

Although it will be understood that various magnitudes of components may be utilized for the circuit shown in FIG. 1 for various operating conditions, the following tabulation of component values has been found to work well in practice:

$V_{CC}$ = 1 volt
$R_{22}$ = 150 K ohms
$R_{28}$ = 1 K ohms
$R_{30}$ = 150 K ohms
$R_{38}$ = 150 K ohms
$R_{42}$ = 200 K ohms
$R_{44}$ = 10 K ohms
$R_{50}$ = 200 K ohms
$C_{34}$ = 127 pf
$C_{26}$ = 100 pf
$C_{32}$ = 27 pf
$C_{40}$ = 27 pf
$C_{48}$ = 200 pf A circuit constructed in accordance with the following component values provides a maximum operating frequency of about 20 KHz, with an on-time of about 40 microseconds. A power drain at 20 KHz for this circuit is about 24 microwatts for a $V_{CC}$ equal to about one volt. The circuit operated satisfactorily linearly over an operating temperature of −40°C to 125°C.

The present circuit is particularly adapted for fabrication as a miniaturized integrated circuit. For example, both pairs of the complementary transistors may be formed according to the disclosure of copending patent application Ser. No. 650,303, entitled "Process for Fabricating Monolithic Circuits Having Matched Complementary Transistors and Products," filed June 30, 1967, now U.S. Pat. No. 3,465,215, issued Sept. 2, 1969. However, the present circuit may also be advantageously utilized with conventional transistor circuit applications. The transistor 46 and diode 52 may be diffused at the same time on the same slice to provide the desired matched conduction characteristics and temperature coefficients.

Figure 5:
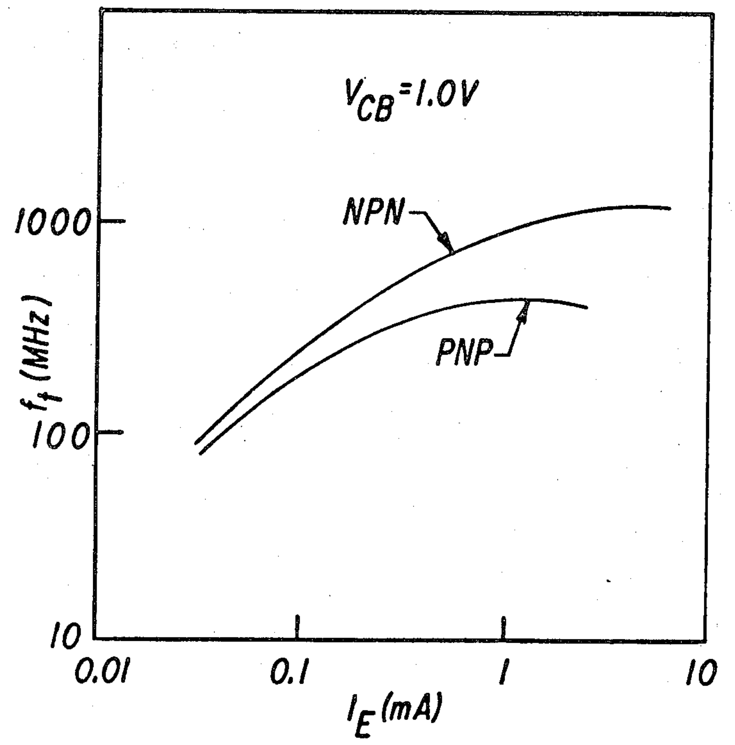
FIG. 5 is a graph illustrating the variance of emitter current versus $f_T$ of one pair of the complementary transistors shown in FIG. 1.
Figure 6:
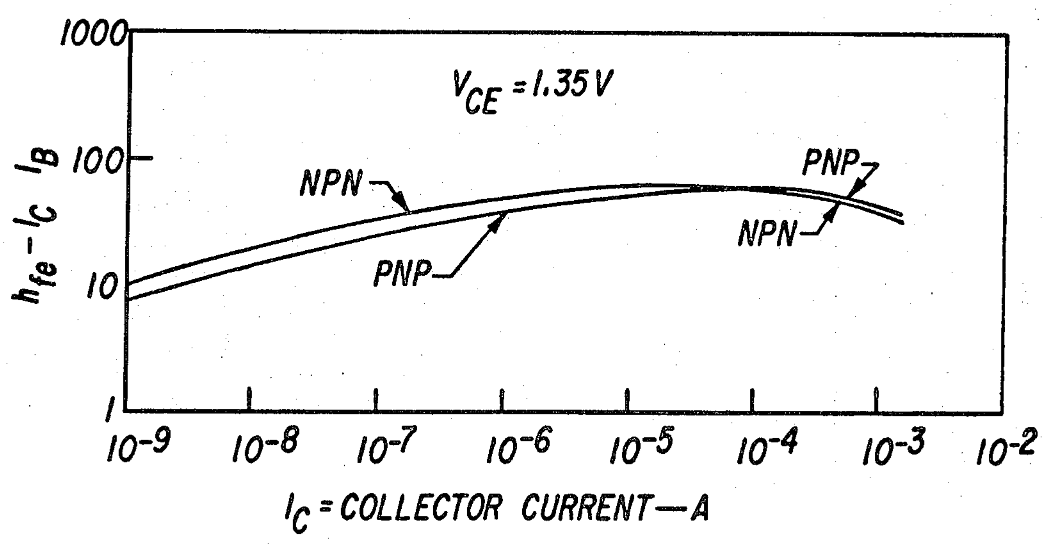
FIG. 6 is a graph illustrating the collector current versus $h_{FE}$ of one of the pairs of complementary transistors shown in the circuit of FIG. 1.

FIGS. 5 and 6 illustrate characteristics of each of the pairs of complementary transistors utilized in the circuit of FIG. 1. The parameters illustrated are two of the most important characteristics which provide the extremely low power operation of the present circuit. FIG. 5 illustrates the variance of $f_t$ of both the NPN and PNP transistors of a complementary pair upon variance of the emitter current of the transistors. FIG. 6 illustrates a D.C. forward current transfer ratio of both the NPN and PNP transistors of the complementary pair over a range of collector currents with a $V_{CE}$ of 1.35 volts.

Figure 7:
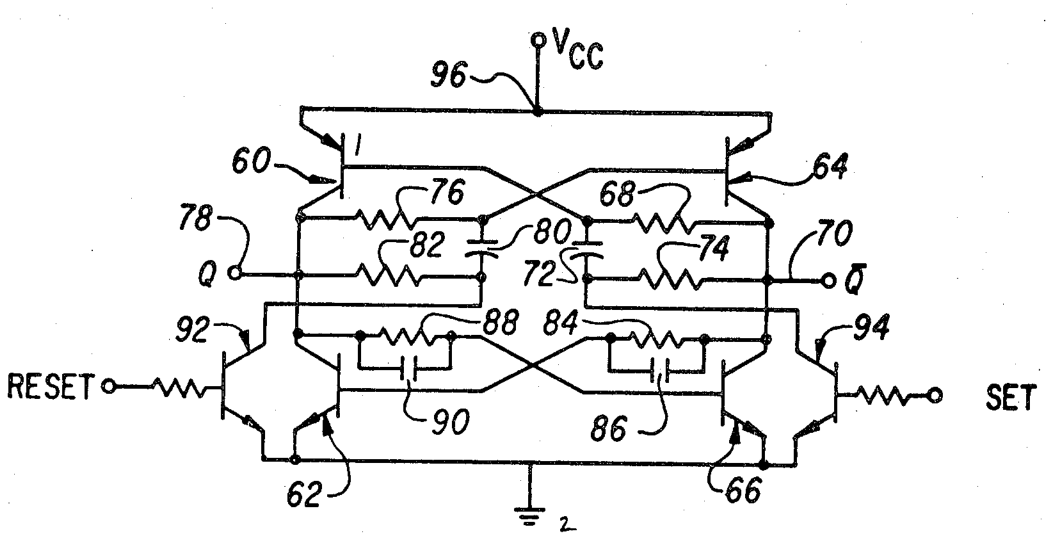
FIG. 7 is a schematic diagram of a bistable multivibrator according to the present invention.

FIG. 7 illustrates a schematic diagram of a bistable multivibrator according to the invention. The multivibrator comprises a PNP transistor 60 connected in a collector-to-collector configuration with an NPN transistor 62. Transistors 60 and 62 are complementary in that they have matched parameters in the manner previously described. The multivibrator also comprises a second pair of complementary transistors including a PNP transistor 64 connected collector-to-collector with an NPN transistor 66. The base of transistor 60 is cross-coupled via a resistance 68 to an output terminal 70 located at the juncture between transistors 64 and 66.

A capacitor 72 and a resistor 74 are connected across the resistance 68. Similarly, the base of the transistor 64 is cross-coupled via a resistance 76 to an output terminal 78 which is connected to the juncture of the transistors 60 and 62. A capacitance 80 and resistor 82 are coupled across the resistance 76.

The base of the transistor 62 is cross-coupled via a parallel network including resistance 84 and capacitor 86 to the $\overline{Q}$ output terminal 70. Similarly, the base of the transistor 66 is cross-coupled via the parallel network including resistance 88 and capacitance 90 to the Q output terminal 78.

A transistor 92 is connected at its collector to the juncture between capacitance 80 and resistor 82 at its emitter to the emitter of transistor 62. The base of transistor 92 is connectable to a source of reset trigger pulses. A transistor 94 is connected at its collector to the juncture between capacitor 72 and resistor 74 and at its emitter to the emitter of transistor 66. The base of transistor 94 is connectable to a source of set pulses for setting of the multivibrator. A source of bias potential $V_{CC}$ is applied to the circuit via terminal 96.

In the operation of the multivibrator shown in FIG. 7, a positive trigger voltage is input to the base of the transistor 94, thereby turning on transistor 94 and applying approximately ground potential to the lower terminal of capacitor 72. Transistor 60 is thus turned on due to the momentary flow of base current through capacitor 72.

The conduction of transistor 60 provides base current through resistor 88 in order to cause conduction of transistor 66. The voltage appearing at output terminal 70 becomes low and the transistor 60 is held on by current flowing through resistance 68. Due to the conduction of transistor 60, the output at terminal 78 is relatively high. Transistor 64 is held off due to Q being at a high voltage. Transistor 62 is held off due to $\overline{Q}$ being at a low voltage.

Figure 8:
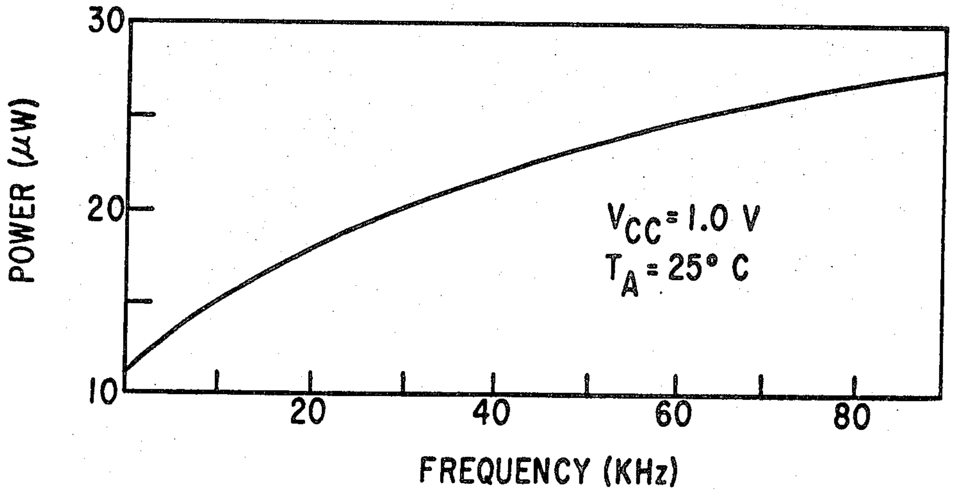
FIG. 8 is a graph illustrating the variance of the power versus the frequency of the circuit shown in FIG. 7.

The multivibrator remains in the set state until a reset trigger pulse is applied to the base of the transistor 92, whereupon transistors 62 and 64 are turned on and transistors 60 and 66 are turned off to reverse the voltage outputs at terminals 70 and 78. The present multivibrator circuit provides a wide range of operating frequencies with extremely low power requirements, as illustrated in FIG. 8. The circuit may operate with a frequency up to 100 KHz with a power requirement of under 30 microwatts. The circuit may operate with magnitudes of $V_{CC}$ of as low as 1 volt over a large range of operating temperatures and provides excellent noise immunity because of the clamping action of the circuit for both the logic zero and one outputs.

Figure 9:
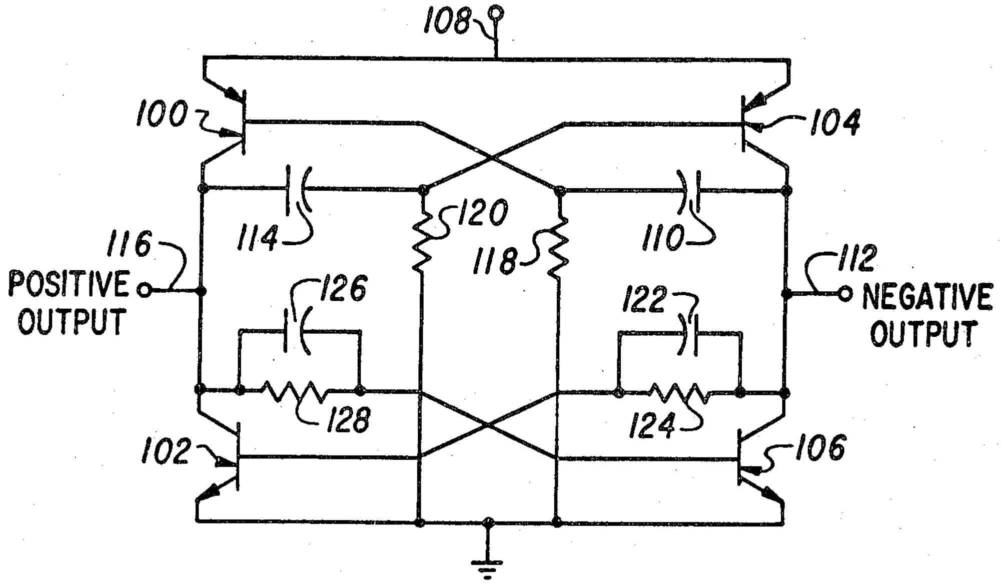
FIG. 9 is a schematic diagram of a free-running multivibrator according to the invention.

FIG. 9 illustrates a schematic diagram of a free-running multivibrator circuit according to the invention. This circuit is somewhat similar to the monostable multivibrator circuit shown in FIG. 1, with the exception that the bases of two transistors are coupled to ground potential through resistances. The circuit comprises complementary PNP transistor 100 and NPN transistor 102 connected collector-to-collector in series. The circuit further comprises a second pair of complementary transistors comprising a PNP transistor 104 connected to an NPN transistor 106.

A source of bias voltage $V_{CC}$ is applied to terminal 108 across the two pairs of complementary transistors. The base of transistor 100 is cross-coupled through a capacitor 110 to an output terminal 112 connected at the juncture of transistors 104 and 106. The base of transistor 104 is cross-coupled through capacitor 114 to the output terminal 116 which is connected at the juncture of transistors 100 and 102. The base of the transistor 100 is coupled through resistance 118 to circuit ground, while the base of transistor 104 is coupled through resistance 120 to circuit ground.

The base of transistor 102 is coupled through parallel capacitor 122 and resistor 124 network to the terminal 112. The base of transistor 106 is cross-coupled via the parallel capacitor 126 and resistance 128 to the terminal 116.

In operation, the free-running multivibrator provides constant oscillatory outputs at terminals 112 and 116 upon the application of a suitable bias voltage $V_{CC}$. Assuming for purposes of explanation that transistor 104 and transistor 102 are conductive while transistors 100 and 106 are non-conductive, the base of transistor 100 is positive and discharging through capacitor 110 and resistor 118. When the base of transistor 100 discharges down to a voltage equal to $V_{CC} - V_{BE}$ of the transistor, transistor 100 will be turned on and the output at terminal 116 will go positive. Base drive for transistor 106 is then provided through transistor 100 and resistance 128 in order to turn transistor 106 on.

Conduction of transistor 106 causes the output at terminal 112 to go negative. Transistor 102 is turned off and held in a non-conductive state because the voltage across resistance 124 is relatively low. Transistor 104 is turned off because of the voltage across the capacitor 114 and is held in a non-conductive state until voltage discharges through capacitor 114 and resistor 120 to a voltage equal to $V_{CC} - V_{BE}$ of transistor 104. Transistor 104 is then turned on and the cycle repeats itself. The voltage outputs appearing on terminals 112 and 114 are complementary and may be used as a clock or for other timing applications.

Figure 10:
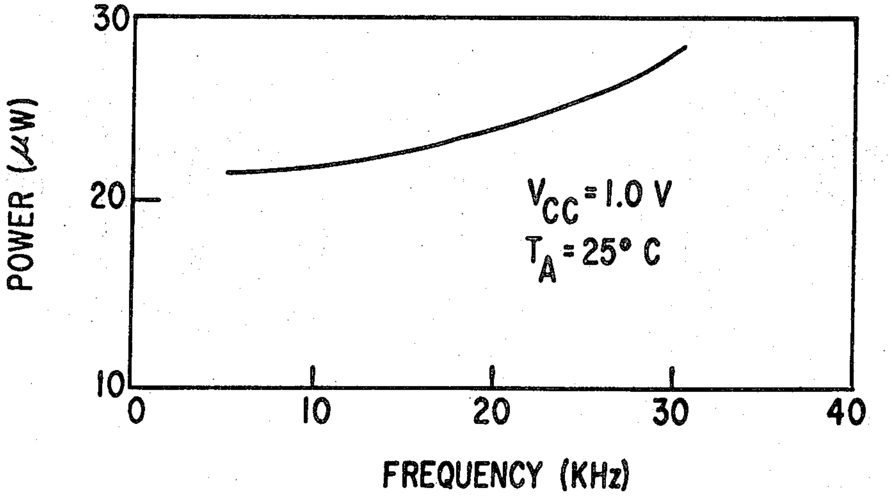
FIG. 10 is a graph illustrating the variance of frequency of operation of the circuit according to the power of the circuit shown in FIG. 9.

FIG. 10 illustrates the relatively wide range of operating frequencies possible with the circuit of FIG. 9, and also illustrates the low power requirements of the circuit. FIG. 10 was obtained by varying the magnitudes of capacitors 110 and 114 while maintaining a symmetrical waveform otuput.

The free-running multivibrator is particularly advantageous in that the frequency of oscillation increases as the magnitude of the bias voltage $V_{CC}$ is increased. Additionally, the output provided by the circuit does not have to be symmetrical with respect to the high and low logic levels thereof, but may be made non-symmetrical by providing different combinations of magnitudes of the capacitor and resistor networks provided for transistors 100 and 104. The circuit may be operated with magnitudes of $V_{CC}$ from 1 to 6 volts, with a frequency of operation determined by essentially the same equation as that provided for the circuit in FIG. 1.

Whereas the present invention has been described with respect to specific embodiments thereof, it will be understood that various changes and modifications will be suggested to one skilled in the art, and it is intended to encompass those changes and modifications as fall within the true scope of the invention as defined in the appended claims.

What is claimed is:

1. A triggered monostable multivibrator having a preselected monostable timing period, comprising in combination:

a. a first normally conducting transistor of one conductivity type having collector, emitter and base electrodes, and a second normally non-conducting transistor of opposite conductivity type having collector, emitter and base electrodes, said first and second transistors being connected in series in a common collector configuration with their emitters being respectively connected to first and second voltage sources;

b. a third normally conducting transistor of said one conductivity type having collector, emitter and base electrodes, and a fourth normally non-conducting transistor of said opposite conductivity type having collector, emitter and base electrodes, said third and fourth transistor being connected in series in a common collector configuration with their emitters being respectively connected to said first and second voltage sources;

c. an input transistor of said opposite conductivity type having collector, emitter and base electrodes with the emitter electrode thereof being connected to said second voltage source and with the base electrode thereof being coupled to a source of input signals;

d. d.c. biasing means of said input transistor coupled between said first and second voltage sources and to the base electrode of said input transistor; and e. first and second output means respectively connected to the common collectors of said first and second transistors and said third and fourth transistors; wherein f. the base electrode of said first transistor is a.c. coupled to said second output means and d.c. connected to said second voltage source; and wherein g. the base electrodes of said second and fourth transistors are respectively a.c. and d.c. coupled to said second and first output means; and wherein h. the base electrode of said third transistor is a.c. and d.c. coupled to said first output means and a.c. coupled to the collector electrode of said input transistor; whereby i. when a trigger signal is coupled to said input transistor said first, second, third and fourth transistors change their conductive state and remain therein for said preselected timing period, whereupon said transistors return to their original conductive state to produce triggered monostable multivibrator operation.

2. A triggered monostable multivibrator as set forth in claim 1 wherein said base electrode of said first transistor is a.c. coupled to said second output means through a capacitor and d.c. connected to said second voltage source through a resistor.

3. A trigged monostable multivibrator as set forth in claim 1 wherein said base electrodes of said second and fourth transistors are respectively a.c. and d.c. coupled to said second and first output means through respective parallel RC circuits.

4. A triggered monostable multivibrator as set forth in claim 1 wherein said base electrode of said third transistor is a.c. and d.c. coupled to said first output means through a series-parallel RC circuit and a.c. coupled to the collector electrode of said input transistor through the capacitor of said series-parallel RC circuit.

5. A triggered monostable multivibrator as set forth in claim 1 wherein said biasing means includes a series connected resistor and diode with the free end of said resistor being coupled to said first voltage source and the free end of said diode being coupled to said second voltage source, and with the junction of said resistor and diode being connected to the base electrode of said input transistor through a resistor.

* * * * *